United States Patent
Pang et al.

(10) Patent No.: US 12,183,720 B2
(45) Date of Patent: Dec. 31, 2024

(54) ARRANGEMENTS FOR LIGHT EMITTING DIODE PACKAGES

(71) Applicant: CreeLED, Inc., Durham, NC (US)

(72) Inventors: Chak Hau Pang, Fanling (HK); JuZuo Sheng, Huizhou (CN); Yue Kwong Lau, Kowloon (HK); Zhenyu Zhong, Tseung Kwan O (HK)

(73) Assignee: CreeLED, Inc., Durham, NC (US)

( * ) Notice: Subject to any disclaimer, the term of this patent is extended or adjusted under 35 U.S.C. 154(b) by 521 days.

(21) Appl. No.: 17/608,268

(22) PCT Filed: May 22, 2019

(86) PCT No.: PCT/CN2019/087957
§ 371 (c)(1),
(2) Date: Nov. 2, 2021

(87) PCT Pub. No.: WO2020/232668
PCT Pub. Date: Nov. 26, 2020

(65) Prior Publication Data
US 2022/0310567 A1    Sep. 29, 2022

(51) Int. Cl.
*H01L 25/075* (2006.01)
*H01L 33/48* (2010.01)
(Continued)

(52) U.S. Cl.
CPC ........ *H01L 25/0753* (2013.01); *H01L 33/486* (2013.01); *H01L 33/54* (2013.01); *H01L 33/505* (2013.01); *H01L 33/58* (2013.01)

(58) Field of Classification Search
CPC ... H01L 25/0753; H01L 33/486; H01L 33/48; H01L 33/52; H01L 33/56; H01L 33/54;
(Continued)

(56) References Cited

U.S. PATENT DOCUMENTS

2009/0146158 A1   6/2009 Park
2010/0110659 A1   5/2010 Nakajima
(Continued)

FOREIGN PATENT DOCUMENTS

CN   101123247 A   2/2008
CN   204315572 U   5/2015
(Continued)

OTHER PUBLICATIONS

International Search Report and Written Opinion for International Patent Application No. PCT/CN2019/087957, mailed Feb. 25, 2020, 8 pages.
(Continued)

*Primary Examiner* — Wasiul Haider
(74) *Attorney, Agent, or Firm* — Withrow & Terranova, P.L.L.C.

(57) ABSTRACT

Solid-state lighting devices including light-emitting diodes (LEDs), and more particularly LED packages are disclosed. Arrangements for LED packages are disclosed that provide improved reliability and improved emission characteristics in a variety of applications, including outdoor LED displays as well as general illumination. LED packages are disclosed with linear arrangements of LED chips and corresponding lenses to provide improved visibility and color mixing at higher viewing angles. LED packages are disclosed that include different types of lenses that are arranged within the same LED package depending on desired emission characteristics. Body structures for LED packages are disclosed that include arrangements for improved adhesion with encapsulant materials and optional potting materials to provide improved moisture barriers.

22 Claims, 10 Drawing Sheets

(51) Int. Cl.
*H01L 33/54* (2010.01)
*H01L 33/50* (2010.01)
*H01L 33/58* (2010.01)

(58) Field of Classification Search
CPC ..... H01L 33/502; H01L 33/50; H01L 33/504; H01L 25/167; H01L 33/58
See application file for complete search history.

(56) References Cited

U.S. PATENT DOCUMENTS

| | | | |
|---|---|---|---|
| 2010/0127294 A1* | 5/2010 | Chen | H01L 33/486 |
| | | | 257/E33.056 |
| 2016/0133615 A1* | 5/2016 | Park | H01L 25/167 |
| | | | 257/98 |
| 2017/0207376 A1* | 7/2017 | Kimura | H01L 33/58 |
| 2017/0263837 A1* | 9/2017 | Jeon | H01L 33/62 |
| 2018/0342657 A1* | 11/2018 | Tran | H01L 23/49582 |
| 2020/0176641 A1* | 6/2020 | Lee | H01L 25/0753 |

FOREIGN PATENT DOCUMENTS

| | | |
|---|---|---|
| CN | 207353242 U | 5/2018 |
| WO | 2018132962 A1 | 7/2018 |
| WO | 2019037094 A1 | 2/2019 |

OTHER PUBLICATIONS

Wang, Haijun, "Practical Technology of Thermal Spraying," National Defense Industry Press, May 2006, pp. 44-45.
Second Office Action for Chinese Patent Application No. 2019800966450, mailed Jan. 18, 2024, 10 pages.
First Office Action for Chinese Patent Application No. 2019800966450, mailed May 31, 2023, 15 pages.
Decision of Rejection for Chinese Patent Application No. 2019800966450, mailed Apr. 14, 2024, 10 pages.

* cited by examiner

ARRANGEMENTS FOR LIGHT EMITTING DIODE PACKAGES

FIELD OF THE DISCLOSURE

The present disclosure relates to solid-state lighting devices including light-emitting diodes (LEDs) and more particularly to LED packages.

BACKGROUND

Solid-state lighting devices such as light-emitting diodes (LEDs) are increasingly used in both consumer and commercial applications.

Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. LED packages are solid-state devices that incorporate one or more LED chips into a packaged device. An LED chip may be enclosed in a component package to provide environmental and/or mechanical protection, light focusing and the like.

LEDs are now being used in displays, both big and small. Large or giant screen LED displays are becoming more common in many indoor and outdoor locations, such as at sporting events, race tracks, concerts and in large public areas such as Times Square in New York City. Many of these displays or screens can be as large as 60 feet tall and 60 feet wide, or larger. These screens can comprise thousands of "pixels" mounted on a flat surface to generate an image, with each pixel containing a plurality of LEDs. The pixels can use high efficiency and high brightness LEDs that allow the displays to be visible from relatively far away, even in the daytime when subject to sunlight. The pixels can have as few as three or four LEDs (one red, one green, and one blue) that allow the pixel to emit many different colors of light from combinations of red, green and/or blue light. In the largest screens, pixel modules may be arranged together to form the display where each pixel module can have three or more LEDs, with some having dozens of LEDs. The pixels can be arranged in a rectangular grid with the size and density of the screen determining the number of pixels. For example, a rectangular display can be 640 pixels wide and 480 pixels high, with the end size of the screen being dependent upon the actual size of the pixels.

Conventional LED based displays are controlled by a computer or control system that accepts an incoming signal (e.g., a TV signal), and based on the particular color needed at the pixel module to form the overall display image, the control system determines which LED in each of the pixel modules is to emit light and how brightly. A power system can also be included that provides power to each of the pixel modules and the power to each of the LEDs can be modulated so that it emits at the desired brightness. Conductors are provided to apply the appropriate power signal to each of the LEDs in the pixel modules.

Some large LED displays are arranged for wide angle or wide pitch emission that allows for a wide lateral range of viewing angles. Pixels for conventional LED displays may use oval lamp LEDs or round lamp LEDs depending on the desired viewing angle, with some using three LED lamps for each pixel. FIG. 1 shows one embodiment of conventional red, green and blue LED lamps 12, 14 and 16 that can be used to form a pixel in a display, and FIG. 2 shows a conventional pixel 10 that includes the red, green and blue LED lamps 12, 14, 16 that are mounted to a substrate 18 using conventional through-hole techniques. Fabricating large screens with three or more separate LED lamps per pixel across a large surface area can be costly and complicated.

The art continues to seek improved LEDs and solid-state lighting devices having increased light output and increased light emission efficiencies without impairing manufacturability and reliability of such devices, while providing desirable illumination characteristics capable of overcoming challenges associated with conventional lighting devices.

SUMMARY

The present disclosure relates to solid-state lighting devices including light-emitting diodes (LEDs), and more particularly to LED packages. Arrangements for LED packages are disclosed that provide improved reliability and improved emission characteristics in a variety of applications, including outdoor LED displays as well as general illumination. In certain embodiments, LED packages include linear arrangements of LED chips and corresponding lenses to provide improved visibility and color mixing at higher viewing angles. In certain embodiments, different types of lenses may be arranged within the same LED package depending on desired emission characteristics. In certain embodiments, body structures for LED packages include arrangements that provide improved adhesion with encapsulant materials and optional potting materials to provide improved moisture barriers.

In one aspect, a lighting emitting diode (LED) package comprises: a body comprising: a primary emission face; a mounting face; and a body mesa formed at the primary emission face, the body mesa forming at least two sidewalls that are coupled to one another by a rounded corner of the body mesa, and wherein the body mesa forms a plurality of cavities at the primary emission face; a plurality of LED chips, wherein each cavity of the plurality of cavities comprises at least one LED chip of the plurality of LED chips; and an encapsulant over the plurality of LED chips and coupled to the at least two sidewalls and the rounded corner of the body mesa. In certain embodiments, the encapsulant forms plurality of lenses and a separate lens of the plurality of lenses is registered with each cavity of the plurality of cavities. Each lens may comprise a round lens base in certain embodiments or an oval lens base in other embodiments. In certain embodiments, at least one lens comprises a round lens base and at least one other lens comprises an oval lens base. In certain embodiments, the encapsulant forms a lens that is registered with a first cavity of the plurality of cavities and the encapsulant further forms a flat surface that is registered with a second cavity of the plurality of cavities. A sensor device may be arranged within the second cavity. In certain embodiments, the plurality of cavities are arranged with a linear alignment. In certain embodiments, one or more surface features are formed in the body mesa between adjacent cavities of the plurality of cavities. In certain embodiments, one or more surface features are formed along at least one of the at least two sidewalls of the body mesa. The encapsulant may comprise a pigment that is registered with a first cavity of the plurality of cavities, the pigment corresponding to an emission color of the at least one LED chip that is within the first cavity. In certain embodiments, the encapsulant comprises separate pigment regions that are registered with each corresponding cavity of the plurality of cavities, and each separate pigment region corresponds to an emission color of the at least one LED chip that is within each cavity.

In another aspect, an LED package comprises: a body comprising a primary emission face and a mounting face, the primary emission face forming a plurality of cavities that are arranged in a linear alignment; a plurality of LED chips, wherein each cavity of the plurality of cavities comprises at least one LED chip of the plurality of LED chips; and an encapsulant over the plurality of LED chips, the encapsulant forming a plurality of lenses and a separate lens of the plurality of lenses is registered with each cavity of the plurality of cavities. In certain embodiments, an aspect ratio of a length and width of the body is at least 2:1. In certain embodiments, the aspect ratio is in a range from about 2:1 to about 4:1. In certain embodiments, the encapsulant comprises a pigment that is registered with a first cavity of the plurality of cavities, the pigment corresponding to an emission color of the at least one LED chip that is within the first cavity. Each lens may comprise a round lens base in certain embodiments or an oval lens base in other embodiments. In certain embodiments, at least one lens comprises a round lens base and at least one other lens comprises an oval lens base.

In another aspect, an LED package comprises: a body comprising a primary emission face and a mounting face, the primary emission face forming a plurality of cavities; a plurality of LED chips, wherein each cavity of the plurality of cavities comprises at least one LED chip of the plurality of LED chips; and an encapsulant over the plurality of LED chips, the encapsulant forming a first lens that is registered with a first cavity of the plurality of cavities and a second lens that is registered with a second cavity of the plurality of cavities, wherein the first lens forms a shape that is different than the second lens. In certain embodiments, the first lens comprises a round lens base and the second lens comprises an oval lens base. In certain embodiments, the encapsulant forms a flat surface that is registered with a third cavity of the plurality of cavities. A sensor device may be arranged within the third cavity. In certain embodiments, the plurality of cavities are arranged with a linear alignment. In certain embodiments, the encapsulant comprises a pigment that is registered with the first cavity that corresponds to an emission color of the at least one LED chip that is within the first cavity.

In another aspect, any one or more aspects or features described herein may be combined with any one or more other aspects or features for additional advantage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
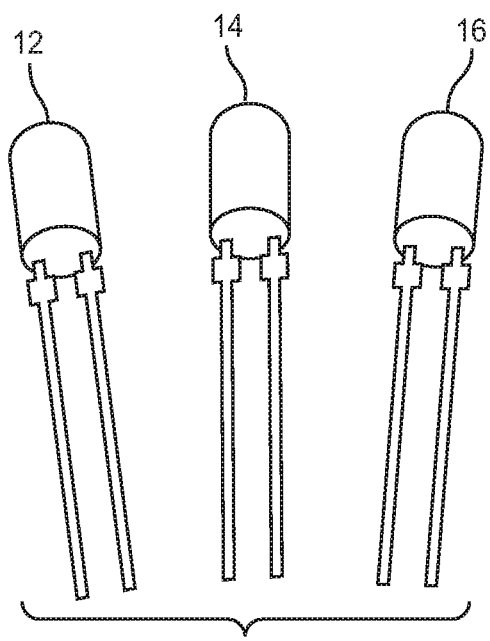
FIG. 1 illustrates conventional light-emitting diode (LED) lamps that may form a conventional pixel of an LED display.
Figure 2:
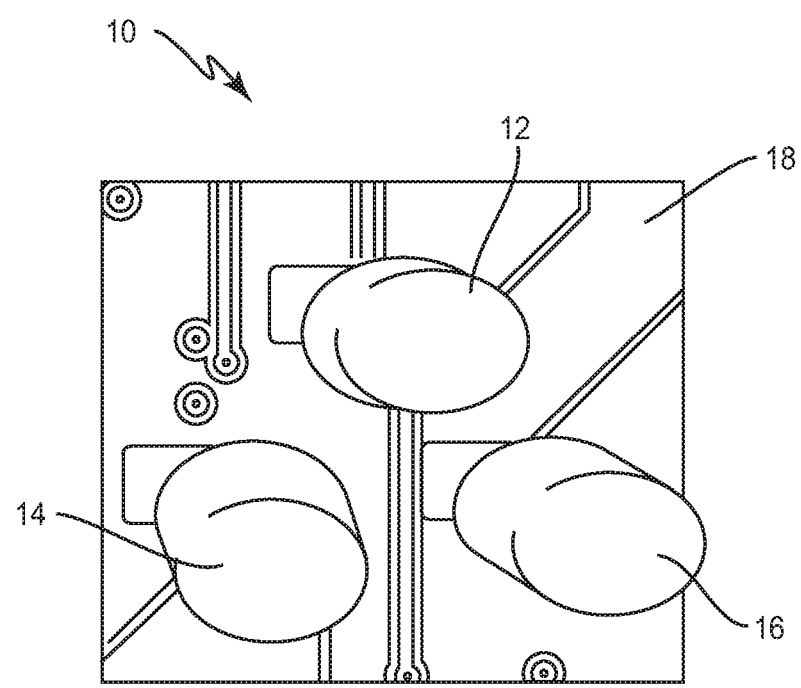
FIG. 2 illustrates conventional LED lamps mounted to a substrate to form a conventional pixel of an LED display.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs), and more particularly to LED packages. Arrangements for LED packages are disclosed that provide improved reliability and improved emission characteristics in a variety of applications, including outdoor LED displays as well as general illumination. In certain embodiments, LED packages include linear arrangements of LED chips and corresponding lenses to provide improved visibility and color mixing at higher viewing angles. In certain embodiments, different types of lenses may be arranged within the same LED package depending on desired emission characteristics. In certain embodiments, body structures for LED packages include arrangements that provide improved adhesion with encapsulant materials and optional potting materials to provide improved moisture barriers.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., Cai-x-ySrxEuyAlSiN3) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip is typically omnidirectional in character. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction.

The present disclosure is directed to various embodiments of surface mount device (SMD) LED packages and LED displays using such packages. Each of the LED packages may be arranged to be used as a single pixel, instead of conventional LED displays where multiple LED packages are used to form each pixel. This may provide easier and less expensive manufacturing of LED displays, improved reliability for LED displays, and in some instances, may result in a higher density or resolution display with an increased pixel count for a given display area.

In certain embodiments, LED packages according to the present disclosure may have one or more round or oval shaped cavities. The cavities can have corresponding round or oval shaped lens formed thereon for shaping or tailoring the overall emission of the LED packages. Oval shaped lenses may provide wide angle or wide pitch emission along an axis or centerline of the LED package or the oval shaped lens. This allows LED displays that are configured for wider viewing angles. In certain embodiments, a particular LED package may have combinations of oval and round shaped cavities with corresponding oval and round shaped lenses.

In addition to the above advantages, LED packages according to the present disclosure can be easier to handle compared to conventional LED lamps used to form pixels for LED displays, and can be easier to assemble into LED displays. The LED packages and resulting LED displays can provide improved emission characteristics while at the same time being more reliable and providing longer life spans.

The different embodiments according to the present disclosure can comprise different shapes and sizes of cavities, with some cavities having a curved surface while others can have an angled side surface and planar base. Solid state emitters are included at or near the center of the emitter base, with some embodiments having emitters that comprise LEDs that emit the same or different colors of light. In some embodiments, the LEDs can comprise red, green and blue emitting LEDs that are individually controllable. The LED packages can emit different colors combinations of light from the LEDs depending on the intensity of each the respective LEDs. The LEDs are arranged in close proximity to one another to approximate a point light source. This may enhance color mixing and uniformity within the far field emission pattern.

The different LED package embodiments can comprise different features to enhance operational reliability. Certain LED packages can have a body with anchoring features arranged to cooperate with an encapsulant to help anchor the encapsulant to the body. This may improve reliability by holding the encapsulant to the body and by resisting moisture intrusion. Certain embodiments can comprise an encapsulant that extends beyond the cavities to cover the surfaces of the LED package's body. This additional encapsulant coverage also increases reliability by improving adhesion of the encapsulant to the body and by resisting moisture intrusion. In LED displays, a potting material can be included between adjacent LED packages, with the potting material overlapping with the encapsulant to improve overall reliability as described below.

The present disclosure is described herein with reference to certain embodiments, but it is understood that the disclosure can be embodied in many different forms and should not be construed as limited to the embodiments set forth herein. In particular, many different LED reflective cup and lead frame arrangements can be provided beyond those described herein, and the encapsulant can provide further features to alter the direction of emissions from the LED packages and LED displays utilizing the LED packages. Although the different embodiments of LED packages discussed below are directed to use in LED displays, they can be used in many other applications either individually or with other LED packages having the same or different peak emission tilt.

Figure 3A:
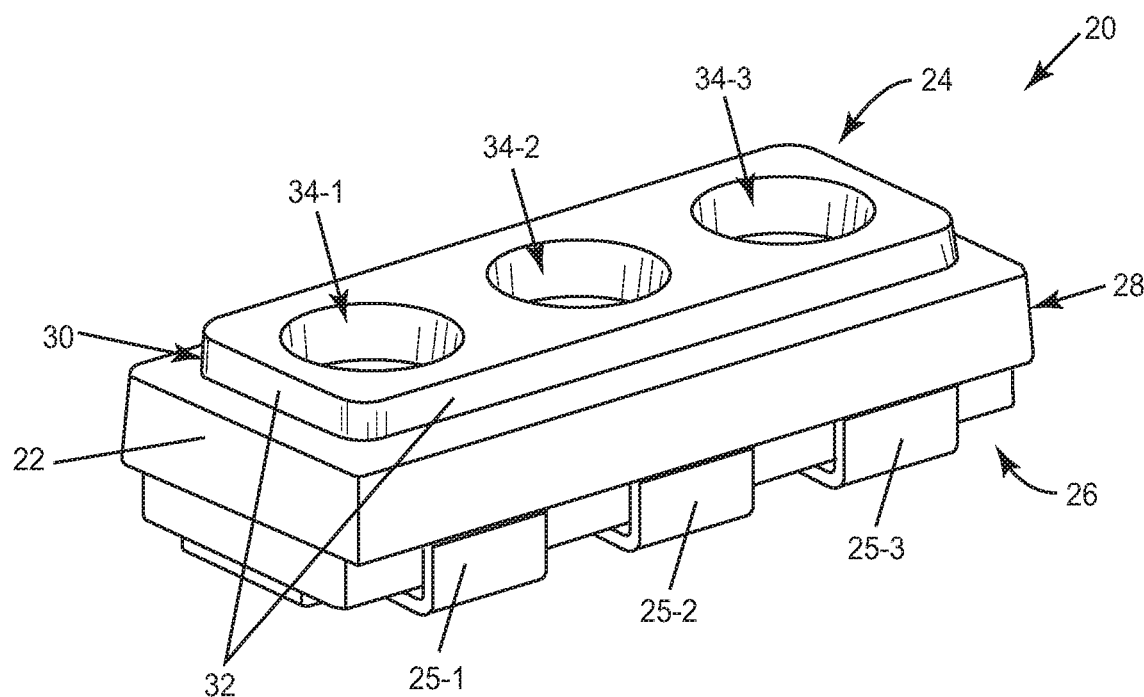
FIG. 3A is a perspective view of an LED package according to embodiments disclosed herein that includes a plurality of cavities formed in a body of an LED package.

FIG. 3A is a perspective view of an LED package 20 according to embodiments disclosed herein. The LED package 20 includes a body 22 that is arranged at least partially around a lead frame structure that includes lead frames 25-1 to 25-3. In certain embodiments, the body 22 includes an insulating material that is formed around and between portions of the lead frames 25-1 to 25-3 to provide mechanical stability as well as electrical insulation. The body 22 may comprise a molded plastic material or a ceramic material, among others. As illustrated, the body 22 comprises a primary emission face 24 for the LED package 20 and a mounting face 26 for the LED package 20 that opposes the primary emission face 24. The primary emission face 24 and the mounting face 26 are peripherally bounded by side faces 28. The lead frames 25-1 to 25-3 are typically structures formed of an electrically conductive metal, such as copper, copper alloys, or other conductive metals. The lead frames 25-1 to 25-3 may initially be part of a larger lead frame structure that is singulated during manufacturing to form individual LED packages. During fabrication, a separate body 22 may be formed in each area of a lead frame structure where an individual LED package will be formed after singulation. In the LED package 20, the lead frame 25-1 to 25-3 is arranged to extend out of the body 22 at or near one or more of the side faces 28. In certain embodiments, the lead frames 25-1 to 25-3 are arranged to bend along the side faces 28 and then bend along the mounting face 26. In this manner, portions of the lead frames 25-1 to 25-3 are arranged on the mounting face 26 in order to make electrical connections to an external source when mounted. For example, the LED package 20 may be mounted on a printed circuit board with electrical traces that correspond to the lead frames 25-1 to 25-3 for providing electrical connections between the printed circuit board and the LED package 20. The body 22 further includes a body mesa 30 that is formed at the primary emission face 24. As illustrated, the body mesa 30 is arranged as a protrusion of the body 22 at the primary emission face 24. In certain embodiments, the body mesa 30 is inset from the side faces 28 of the body 22 to form a step structure along a perimeter of the body 22. The body mesa 30 includes sidewalls 32 that protrude along the primary emission face 24. In certain embodiments, the body mesa 30 forms a plurality of cavities 34-1 to 34-3 at the primary emission face 24. The plurality of cavities 34-1 to 34-3 form cups or recesses in which LED chips are mounted within the LED package 20.

Figure 3B:
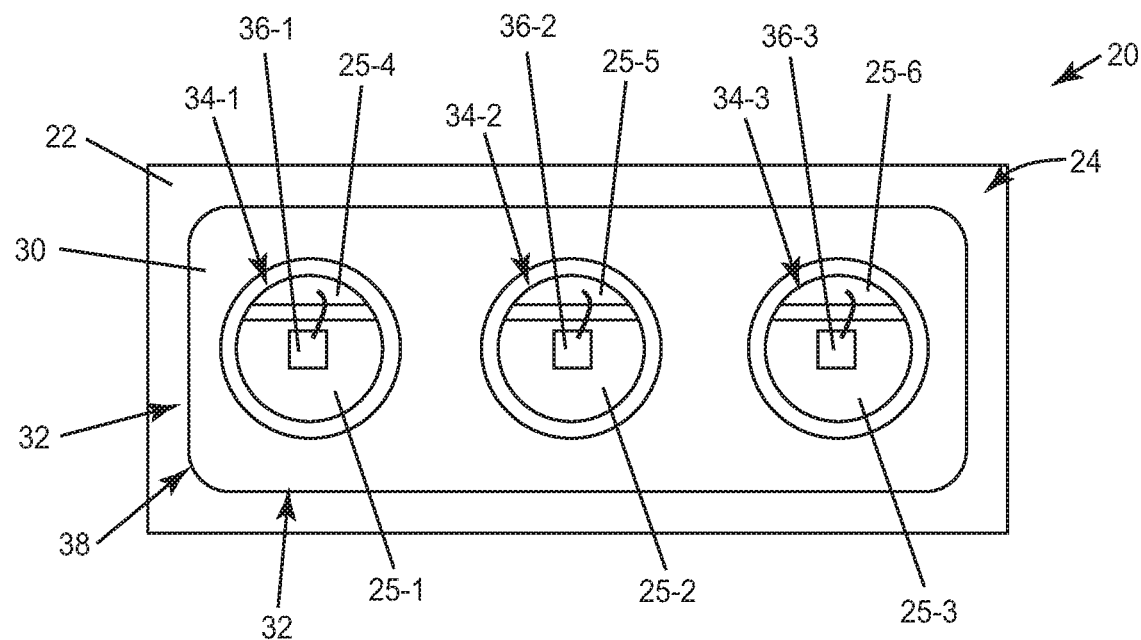
FIG. 3B is a top view of the LED package of FIG. 3A.

FIG. 3B is a top view of the LED package 20 of FIG. 3A. As illustrated, the plurality of cavities 34-1 to 34-3 are arranged in the body 22 and the body mesa 30 at the primary emission face 24. Individual ones of the lead frames 25-1 to 25-3 are exposed and uncovered by the body 22 within each of the cavities 34-1 to 34-3. Additional lead frames 25-4 to 25-6 are visible within each of the cavities 34-1 to 34-3 in the top view of FIG. 3B. In this manner, each of the cavities 34-1 to 34-3 provide access to a different pair of lead frames, e.g. the lead frames 25-1, 25-4 for the cavity 34-1; the lead frames 25-2, 25-5 for the cavity 34-2; and the lead frames 25-3, 25-6 for the cavity 34-3. A plurality of LED chips 36-1 to 36-3 are arranged in the LED package 20 such that each cavity of the plurality of cavities 34-1 to 34-3 comprises at least one of the LED chips 36-1 to 36-3 that is electrically connected to a corresponding pair of the lead frames 25-1 to 25-6. For example, the LED chip 36-1 is mounted within the cavity 34-1 and is electrically connected to the lead frame 25-1 and the lead frame 25-4 for anode and cathode connections. Accordingly, each of the LED chips 36-1 to 36-3 may be configured to be individually addressable such that each of the LED chips 36-1 to 36-3 may be electrically activated independently of one another. This allows an LED display to incorporate an array of LED packages 20, where each LED package 20 provides a pixel of the LED display. As illustrated in FIG. 3B, the LED chip 36-1 may be mounted to and electrically connected to the lead frame 25-1 and an electrical connection with the lead frame 25-4 may be provided by a wire bond. In other embodiments, the LED chips 36-1 to 36-3 may be flip-chip mounted to their respective lead frame pairs 25-1, 25-4; 25-2, 25-5; 25-3, 25-6 such that electrical connections are made without wirebonds. In certain embodiments, the LED chips 36-1 to 36-3 are configured to emit different peak wavelengths of light. For example, the LED chip 36-1 may be configured to emit red light, the LED chip 36-2 may be configured to emit green light, and the LED chip 36-3 may be configured to emit blue light. In other embodiments, the LED chips 36-1 to 36-3 may be configured to emit the same or similar peak wavelengths of light. Notably, the plurality of cavities 34-1 to 34-3 are arranged in a linear alignment across the primary emission face 24 of the LED package 20. In this manner, the LED chips 36-1 to 36-3 may also be arranged in a linear alignment. For LED display applications, a plurality of LED packages 20 with such linear alignments may provide improved visibility at higher viewing angles as well as improved color mixing between the LED chips 36-1 to 36-3 at higher viewing angles. Depending on the desired viewing angles for a particular LED display, the linear alignments of the LED packages 20 may be arranged with vertical or horizontal orientations within the LED display.

As further illustrated in FIG. 3B, the sidewalls 32 of body mesa 30 are coupled to one another by rounded corners 38 or rounded corner transitions. In this manner, the rounded corners 38 are devoid of sharp edges or transitions from one sidewall 32 to the next. As will later be described in more detail, the rounded corners 38 may provide improved adhesion with other elements of the LED package 20, such as later-described encapsulant and/or potting materials.

Improved adhesion with encapsulant materials may provide an improved moisture/water barrier for the LED package 20, which is particularly beneficial for outdoor applications.

Figure 3C:
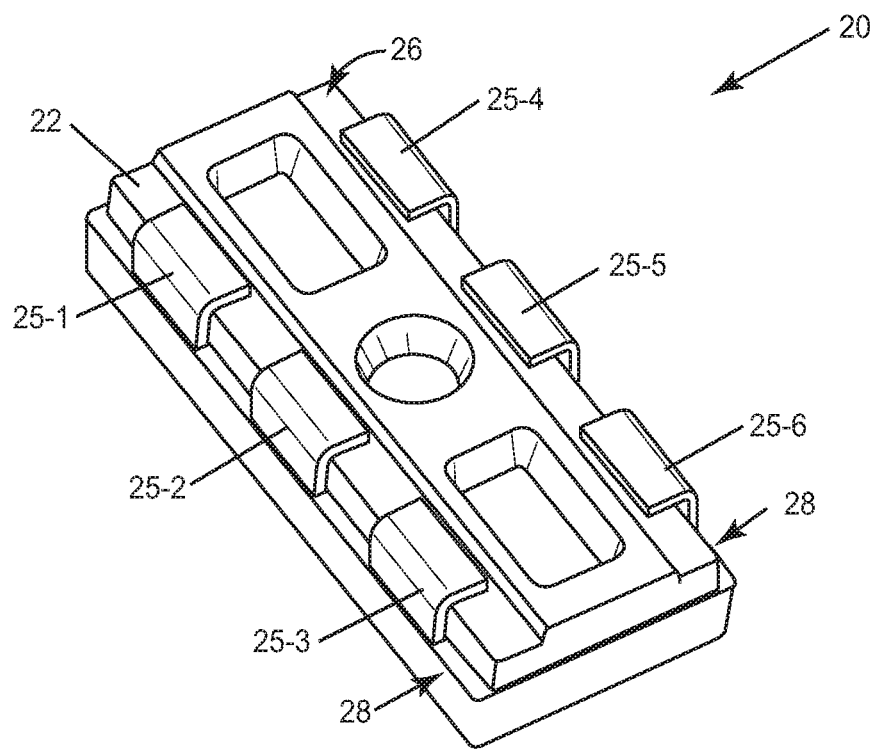
FIG. 3C is a perspective view of the mounting face of the LED package of FIG. 3A.

FIG. 3C is a perspective view of the mounting face 26 of the LED package 20 of FIG. 3A. As illustrated, the lead frames 25-1 to 25-6 are configured to protrude out of the body 22 and extend along opposing ones of the side faces 28. The lead frames 25-1 to 25-6 additionally bend along the mounting face 26 as previously described. In this manner, a printed circuit board or other submount on which the LED package 20 is mounted may include electrical traces that correspond to each of the lead frames 25-1 to 25-6.

Figure 4A:
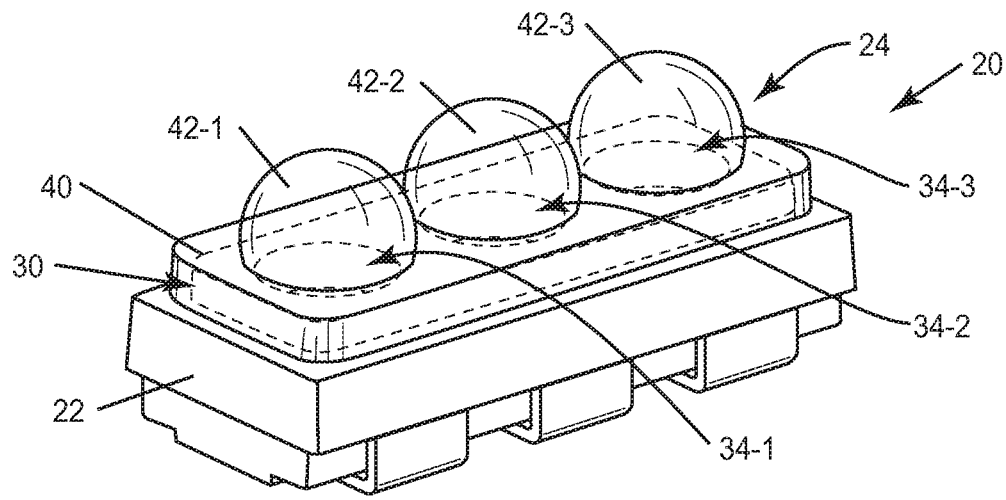
FIG. 4A is a perspective view of the LED package of FIG. 3A after formation of an encapsulant according to embodiments disclosed herein.

FIG. 4A is a perspective view of the LED package 20 of FIG. 3A after an encapsulant 40 has been formed. The encapsulant 40 may comprise a material such as silicone or epoxy that is arranged to fill each of the cavities 34-1 to 34-3 and thereby encapsulate each of the LED chips (36-1 to 36-3 of FIG. 3B). In certain embodiments, the encapsulant 40 may transmit approximately 100% of light emitted from the emitters, while in other embodiments it may transmit less than 100%. In certain embodiments, the encapsulant 40 may comprise a conversion material or scattering material arranged throughout or arranged in different locations in the encapsulant 40. As illustrated, the encapsulant 40 forms a plurality of lenses 42-1 to 42-3 such that a separate lens 42-1 to 42-3 is registered with a separate one of the cavities 34-1 to 34-3. In this manner, the plurality of lenses 42-1 to 42-3 are configured to focus, alter, or otherwise tailor the emission pattern of light generated by each of the LED chips (36-1 to 36-3 of FIG. 3B). In certain embodiments, the lenses 42-1 to 42-3 form a shape that is hemispheric, although other shapes are contemplated depending on the desired emission pattern. Some examples of alternative shapes include oval, ellipsoid bullet, flat, hex-shaped, and square. In certain embodiments, a suitable shape includes both curved and planar surfaces, such as a hemispheric top portion with planar side surfaces. It is understood that the encapsulant 40 may also be textured to improve light extraction in certain embodiments. The encapsulant 40 and lenses 42-1 to 42-3 may be formed over the body 22 using different known molding processes. In certain embodiments, the encapsulant 40 may be formed to extend along the primary emission face 24 of the LED package 20 such that the encapsulant 40 extends beyond peripheral boundaries of the body mesa 30. In this manner, the encapsulant 40 is coupled to the sidewalls (32 of FIG. 3B) and the rounded corners (38 of FIG. 3B) of the body mesa 30, thereby providing improved adhesion between the encapsulant 40 and the body 22 of the LED package 20.

Figure 4B:
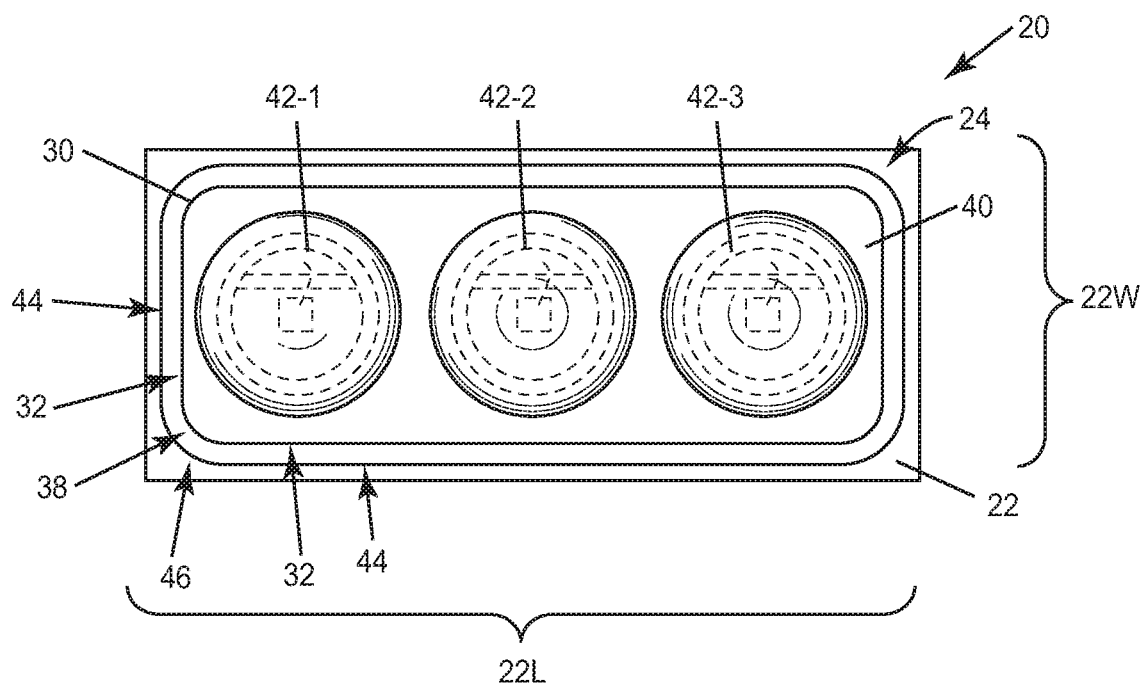
FIG. 4B is a top view of the LED package of FIG. 4A.

FIG. 4B is a top view of the LED package 20 of FIG. 4A. As illustrated, the encapsulant 40 and the plurality of lenses 42-1 to 42-3 are formed over the body 22. As illustrated, the plurality of lenses 42-1 to 42-3 include a round lens base, although other shapes are possible as previously described. Additionally, a portion of the encapsulant 40 is arranged to extend beyond peripheral boundaries of the body mesa 30, where the peripheral boundaries are defined by the sidewalls 32 and rounded corners 38 of the body mesa 30. In certain embodiments, the encapsulant 40 is arranged conformally around the body mesa 30 such that the encapsulant 40 is peripherally bounded on the body 22 by encapsulant sidewalls 44 and rounded encapsulant corners 46. In such a conformal arrangement, the encapsulant sidewalls 44 and rounded encapsulant corners 46 are formed to correspond with the sidewalls 32 and rounded corners 38, respectively, of the body mesa 30. Notably, the plurality of lenses 42-1 to 42-3 are arranged in a linear alignment across the primary emission face 24 of the LED package 20. In this manner, the LED package 20 may be suited to provide improved visibility at higher viewing angles as well as improved color mixing in LED display applications. In order to accommodate the linear arrangement of the lenses 42-1 to 42-3 and the corresponding LED chips (36-1 to 36-3 of FIG. 3B) registered with each of the lenses 42-1 to 42-3, the body 22 of the LED package 20 is arranged in an elongated manner. For example, in certain embodiments an aspect ratio of a length 22L to a width 22W of the body 22 from the top view of FIG. 4B is greater than 1:1. In certain embodiments, the aspect ratio of the length 22L to the width 22W of the body 22 is at least 2:1 or greater. In certain embodiments, the aspect ratio of the length 22L to the width 22W of the body 22 is in a range of at least 2:1 to 4:1.

In certain embodiments, the encapsulant 40 may include various pigments that are configured to convey information. For example, the encapsulant 40 may include a blue pigment that is registered with a first lens 42-1 (or cavity 34-1 of FIG. 4A) and corresponds with a blue emission color of an LED chip that is mounted underneath and registered with the first lens 42-1 (and within the cavity 34-1 of FIG. 4A). In this manner, the first lens 42-1 will have a blue appearance and the location of the blue LED chip within the LED package 20 is identifiable without having to electrically activate the blue LED chip. In certain embodiments, the encapsulant 40 includes a separate pigment region that is registered with each of the plurality of cavities (34-1 to 34-3 of FIG. 4A) and corresponding lenses 42-1 to 42-3, and each separate pigment region corresponds to an emission color of an LED chip that is within each cavity. For example, red, green, and blue pigments may be arranged in separate regions and registered with separate lenses 42-1 to 42-3 to identify locations of red, green, and blue LED chips within the LED package 20.

Figure 4C:
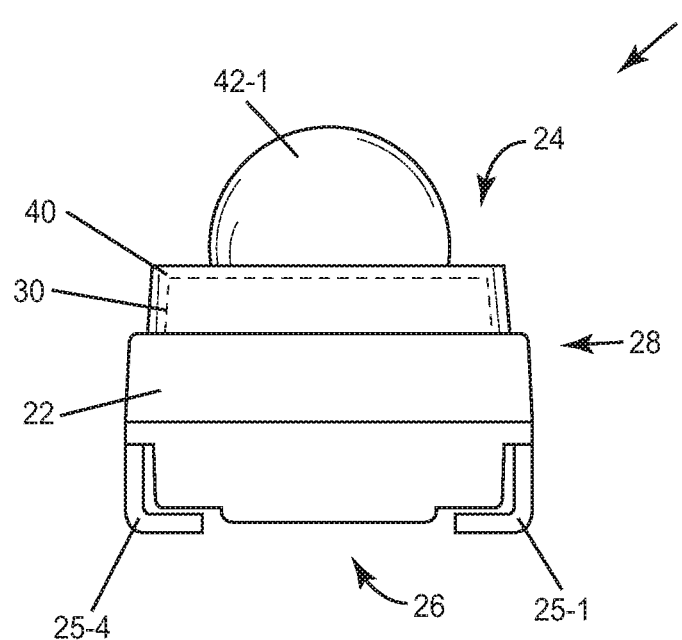
FIG. 4C is an end view of the LED package of FIG. 4A.

FIG. 4C is an end view of the LED package 20 of FIG. 4A. As illustrated, the body mesa 30 of the body 22 protrudes or extends upward at the primary emission face 24, thereby forming a stepped structure at side faces 28 of the body 22. The encapsulant 40 peripherally encloses the body mesa 30 along the stepped structure. In certain embodiments, the encapsulant 40 encloses the body mesa 30 and is further arranged to be inset from the side faces 28 along the stepped structure. The encapsulant 40 may also be arranged to form the lens 42-1 as previously described. The lead frames 25-1 to 25-4 are arranged to exit the body 22 in a direction toward the mounting face 26 and bend along the mounting face 26. In certain embodiments, the lead frames 25-1 to 25-4 may bend along corresponding indentations, stepped features, or cavities that are arranged along the body 22. In other embodiments, the lead frames 25-1 to 25-4 may be arranged with other configurations, such as extending laterally from the side faces 28 without bending along the mounting face 26.

Figure 4D:
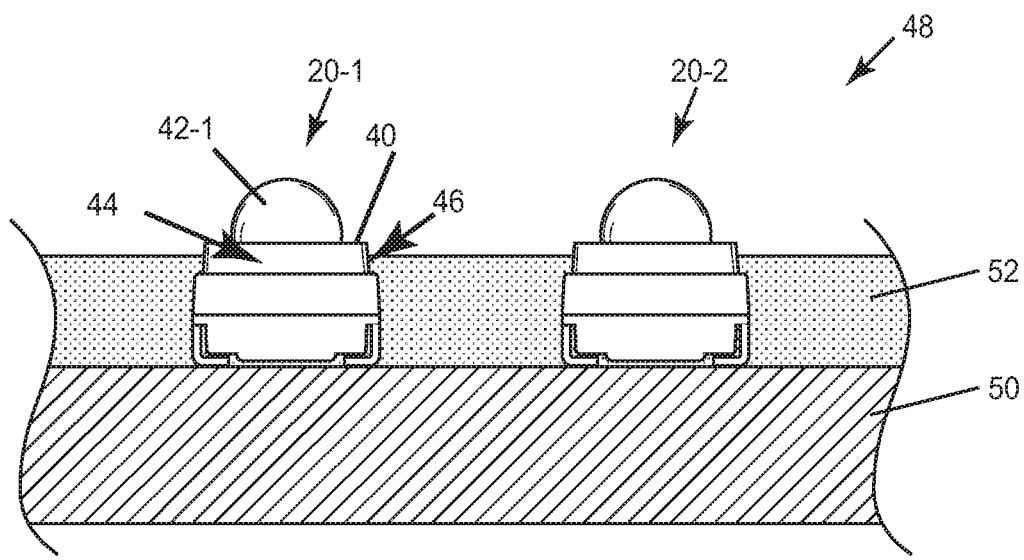
FIG. 4D is a cross-sectional view of an LED device where at least two of the LED packages of FIG. 4A are mounted on a submount and a potting material is additionally arranged on the submount.

FIG. 4D is a cross-sectional view of an LED device 48, such as an LED display, where at least two LED packages 20-1, 20-2 are mounted on a submount 50, and a potting material 52 is provided to improve reliability and moisture or water resistance of the LED device 48. The LED packages 20-1, 20-2 may be similar to the LED package 20 of FIG. 4A. As illustrated, the LED package 20-1, 20-2 are mounted to the submount 50, and the submount 50 may include a printed circuit board or the like with corresponding electrical connections to each of the LED packages 20-1, 20-2. The potting material 52 is arranged to cover surfaces of the submount 50 that are between the LED packages 20-1, 20-2 as well as overlap with portions of the LED packages 20-1, 20-2. In particular, the potting material 52 is arranged along portions of the encapsulant sidewalls 44 and rounded encapsulant corners 46 for each of the LED packages 20-1, 20-2. In this manner, the rounded encapsulant corners 46 may reduce sharp corners of transitions such that improved adhesion with the potting material 52 is provided. Improved adhesion between the potting material 52 and the encapsulant 40 may provide an improved moisture or water barrier, thereby allowing the LED device 48 to be suitable for operation in wet environments, such as outdoor applications. The potting material 52 can be included between adjacent ones of the LED packages 20-1, 20-2 in the LED device 48. The potting material 52 may be arranged in different ways, with the embodiment in FIG. 4D having sufficient thickness to cover portions of the LED packages 20-1, 20-2 including the respective lead frames 25-1, 25-2, while leaving the lens 42-1 devoid of the potting material 52. The potting material 52 may include many different materials, with some embodiments comprising a silicone based material that is particularly suitable to outdoor applications.

Figure 5A:
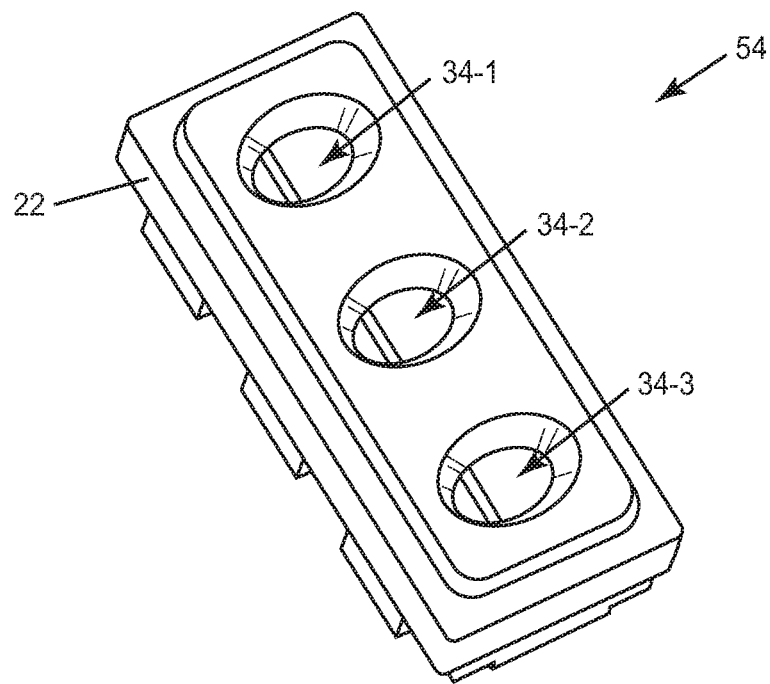
FIG. 5A is a perspective view of an LED package that includes cavities that are formed in the body with an oval shape according to embodiments disclosed herein.
Figure 5B:
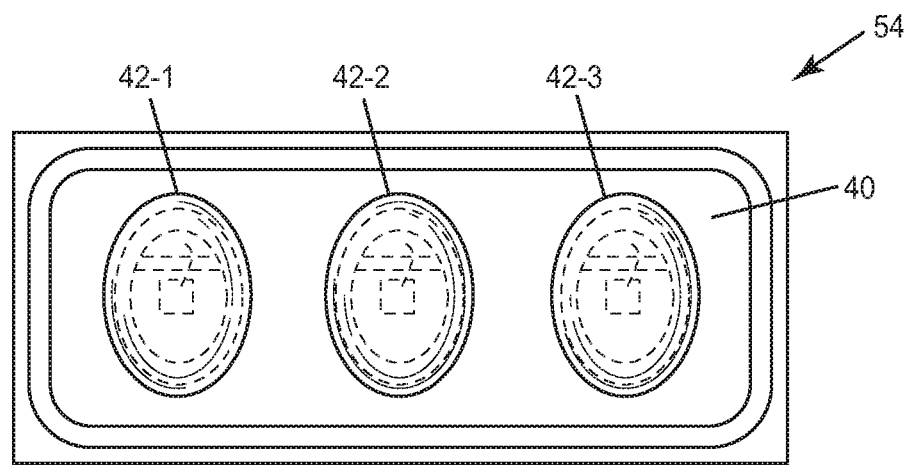
FIG. 5B is a top view of the LED package of FIG. 5A after formation of an encapsulant according to embodiments disclosed herein.

FIG. 5A is a perspective view of an LED package 54 where the cavities 34-1 to 34-3 that are formed in the body 22 form an oval shape. The LED package 54 is similar to the LED package 20 of FIG. 3A. Instead of the round or circular shapes illustrated in FIG. 3A, the cavities 34-1 to 34-3 of the LED package 54 have oval shaped openings in the body 22. FIG. 5B is a top view of the LED package 54 of FIG. 5A where the encapsulant 40 has been formed as previously described. As illustrated, the encapsulant 40 forms the lenses 42-1 to 42-3 that comprise corresponding oval shapes. In particular, each of the lenses 42-1 to 42-3 includes an oval lens base that corresponds with a particular oval-shaped cavity 34-1 to 34-3 of FIG. 5A. In this manner, the LED package 54 is configured to provide a wider viewing angle for LED chips within the package where the wider viewing angle corresponds with a long axis of each of the oval-shaped lenses 42-1 to 42-3. Accordingly, the LED package 54 may be suited for high angle applications, such as LED displays mounted at elevated heights with wider vertical viewing angles or LED displays with wider horizontal viewing angles depending on the desired application and the corresponding orientation of the LED package 54.

Figure 6:
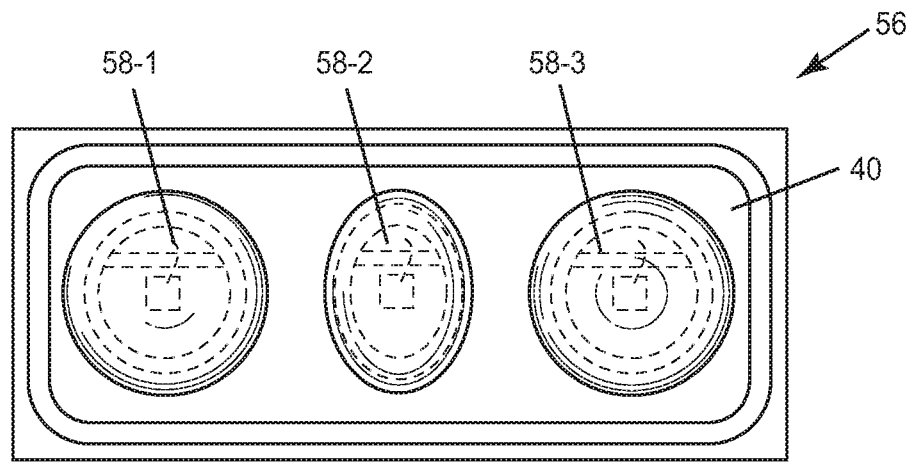
FIG. 6 is a top view of an LED package with an encapsulant that includes lenses with differing shapes from one another according to embodiments disclosed herein.

In certain embodiments disclosed herein, a particular LED package may include at least one lens that is arranged with a different shape than other lenses of the LED package. By having differently shaped lenses within the same LED package, viewing angles and light distribution patterns may be tailored for various applications. In this regard, FIG. 6 is a top view of an LED package 56 that is similar to the LED package of 20 of FIG. 3A, but the encapsulant 40 includes lenses 58-1 to 58-3 with differing shapes from one another. In particular, the lens 58-2 is arranged with an oval shape as previously described, and the lenses 58-1, 58-3 are arranged with circular or hemispherical shapes as previously described. In this manner, an LED chip that is registered with the lens 58-2 will have a wider light distribution pattern and corresponding viewing angle than LED chips that are registered with the lenses 58-1, 58-3. For example, in certain applications, it may be desirable for only one of a red, green, or blue LED chip to have a wider viewing than the LED chips configured for different emission colors. In other applications, all LED chips may be configured to provide the same emission color, such as red, green, blue, or white and only a subset of the LED chips are provided with wider viewing angles. Depending on the application and the desired viewing angles, the shapes of the lenses 58-1 to 58-3 may differ with other configurations.

Figure 7:
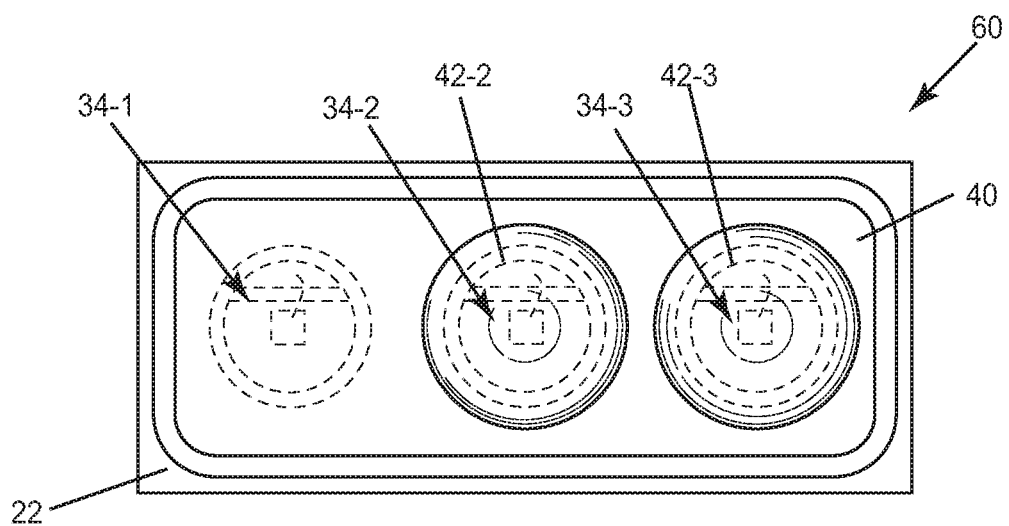
FIG. 7 is a top view of an LED package with an encapsulant that includes lenses registered with less than all of the cavities of the LED package according to embodiments disclosed herein.

FIG. 7 is a top view of an LED package 60 that is similar to the LED package of 20 of FIG. 3A, but includes the lenses 42-2, 42-3 over or registered with less than all of the cavities 34-1 to 34-3 of the body 22. As illustrated, the lenses 42-2, 42-3 of the encapsulant 40 are registered with the cavities 34-2, 34-3 as previously described; however, the encapsulant 40 may be devoid of a lens over the cavity 34-1. In this manner, the encapsulant 40 may form a flat or substantially flat surface that is registered with the cavity 34-1. This may be beneficial for embodiments where the cavity 34-1 includes devices other than LED chips, such as a sensor device including a light sensor, an infrared sensor, an ultraviolet sensor, and the like. In other embodiments and depending on the application, the cavity 34-1 that is devoid of a lens may include an LED chip.

While LED packages of previously described embodiments are illustrated with three cavities, LED packages according to the present disclosure may have less than three cavities or greater than three cavities depending on the application. Additionally, various embodiments disclosed herein, such as those providing improved moisture or water barriers, may also be well suited for LED packages that include a single LED chip or a single cavity that includes one or more LED chips.

Figure 8:
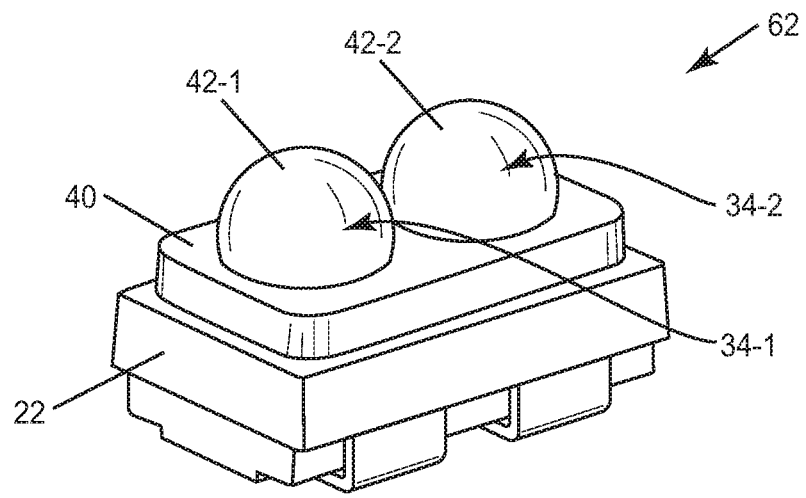
FIG. 8 is a perspective view of an LED package where the encapsulant forms two lenses that are registered with two cavities according to embodiments disclosed herein.

FIG. 8 is a perspective view of an LED package 62 where the encapsulant 40 forms two lenses 42-1, 42-2 that are registered with two cavities 34-1, 34-2 of the body 22. In certain embodiments, the LED package 62 may be configured to provide different emission wavelengths or colors from each of the cavities 34-1, 34-2, such as one of red, green, or blue from the cavity 34-1 and a different one of red, green, or blue from the cavity 34-2. In certain embodiments, the LED package 62 may be configured to provide a warm white emission spectrum from the cavity 34-1 and a cool white emission spectrum from the cavity 34-2, where the warm white emission and the cool white emission are separately controllable as previously described. In this manner, the LED package 62 may be suitable for general illumination applications.

Figure 9:
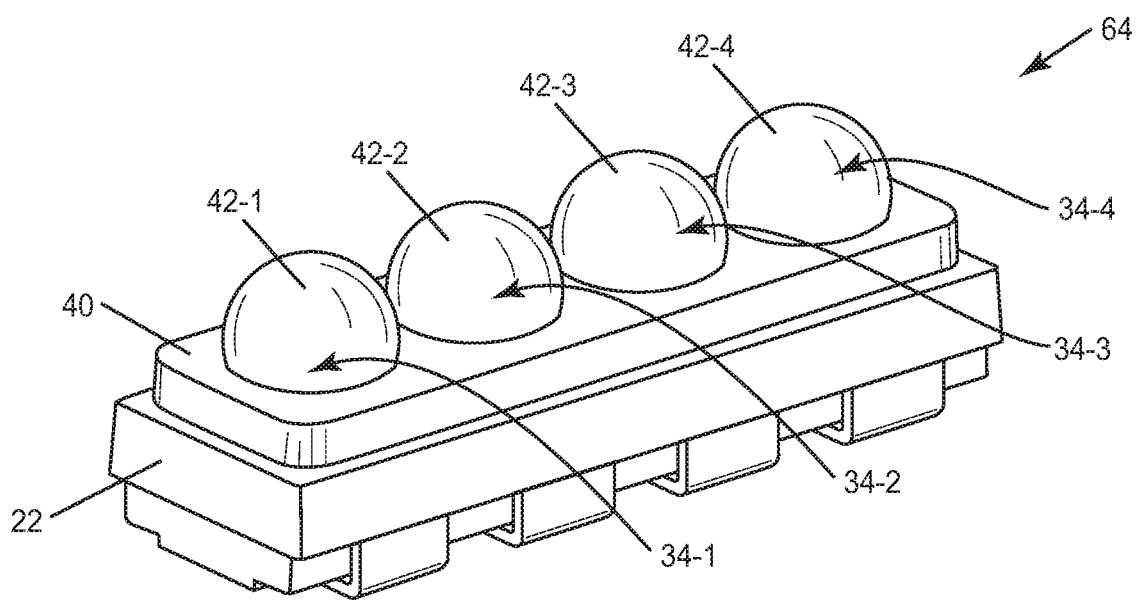
FIG. 9 is a perspective view of an LED package where the encapsulant forms four lenses that are registered with four cavities according to embodiments disclosed herein.

FIG. 9 is a perspective view of an LED package 64 where the encapsulant 40 forms four lenses 42-1 to 42-4 that are registered with four cavities 34-1 to 34-4 of the body 22. In certain embodiments, the LED package 64 may be configured to provide different emission wavelengths or colors from each of the cavities 34-1 to 34-4. By way of example, the LED package 64 may be configured to provide red emission from the cavity 34-1, green emission from the cavity 34-2, blue emission from the cavity 34-3, and amber emission from the cavity 34-4. Other combinations of colors are possible, such as the inclusion of yellow, purple, or cyan LED chips. While four cavities 34-1 to 34-4 and corresponding lenses 42-1 to 42-4 are illustrated, additional numbers of cavities and lenses may be arranged in the LED package 64 depending on the application. In this manner, the LED package 64 may be configured to provide more than three colors for improved color rendering in LED display applications.

Figure 10:
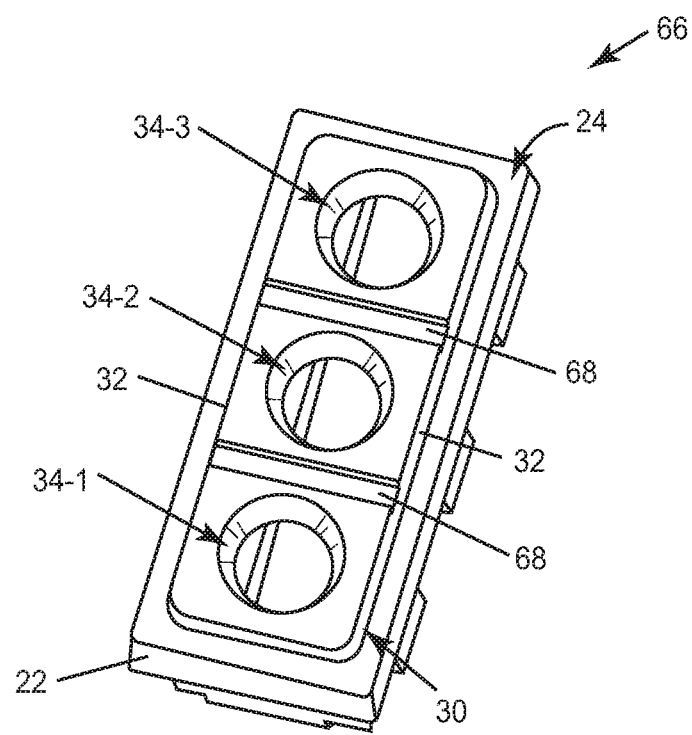
FIG. 10 is a perspective view of an LED package that includes a body with one or more surface features that are configured to provide increased surface area with an encapsulant according to embodiments disclosed herein.

FIG. 10 is a perspective view of an LED package 66 that includes a body 22 with one or more surface features 68 that are configured to provide increased surface area with an encapsulant (40 of FIG. 4A) as previously described. As illustrated in FIG. 10, the surface features 68 are provided on the body mesa 30 such that the surface features 68 extend between adjacent cavities 34-1 to 34-3 of the body 22. In certain embodiments, the surface features 68 extend entirely from one sidewall 32 of the body mesa 30 to another. In this manner, the surface features 68 may provide improved anchoring/adhesion of the encapsulant (40 of FIG. 4A) as well as improved moisture or water resistance for the body 22. As illustrated in FIG. 10, the surface features 68 may comprise trenches formed in the body 22. In particular, the surface features 68 are arranged as trenches in the body mesa 30. It is understood that the surface features 68 may have different numbers and sizes arranged along the body 22. For example, secondary features such as notches, cuts, cutouts, or texturing of different shapes and sizes may be added along different portions of trenches to form the surface features 68. Top edges of the surface features 68 may comprise rounded corners to reduce sharp edges of the body 22 that may contribute to voids when the encapsulant material is formed. The surface features 68 may be formed using many different methods including formation during molding the body 22 as a selective removal step (e.g., etching, machining, etc.) after the body 22 is formed. The surface features 68 may be formed with different or varying depths within the body 22.

Figure 11:
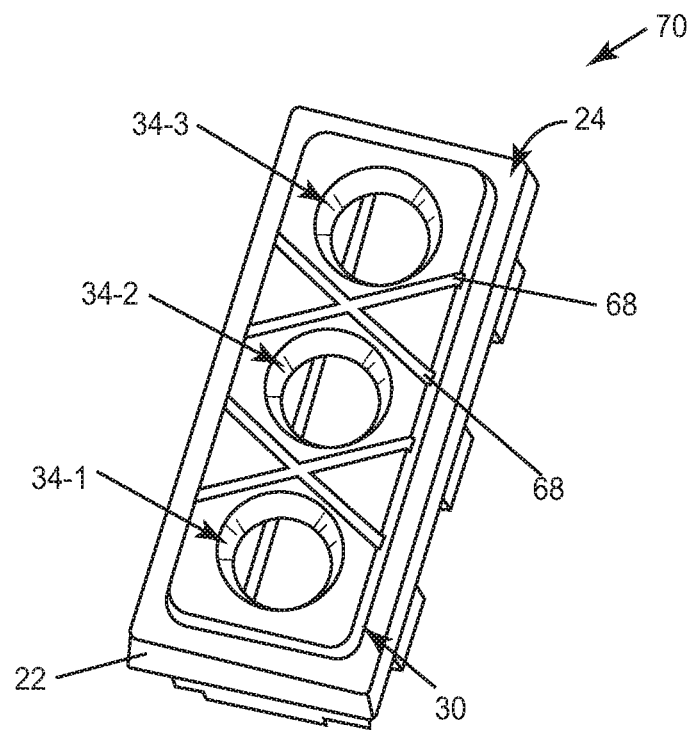
FIG. 11 is a perspective view of an LED package that includes a body with one or more surface features that are provided in an alternative arrangement to FIG. 10.

FIG. 11 is a perspective view of an LED package 70 that includes a body 22 where the one or more surface features 68 are provided in an alternative arrangement. In FIG. 11, the surface features 68 are arranged as intersecting trenches, notches, cuts, or cutouts on the body mesa 30 and between adjacent ones of the cavities 34-1 to 34-3 of the body 22. In certain embodiments, the intersection of the surface features 68 are arranged between adjacent ones of the cavities 34-1 to 34-3. In this manner, the surface features 68 form an X-shape on the body 22, thereby providing increased surface area for the encapsulant (40 of FIG. 4A) compared with single trenches.

Figure 12:
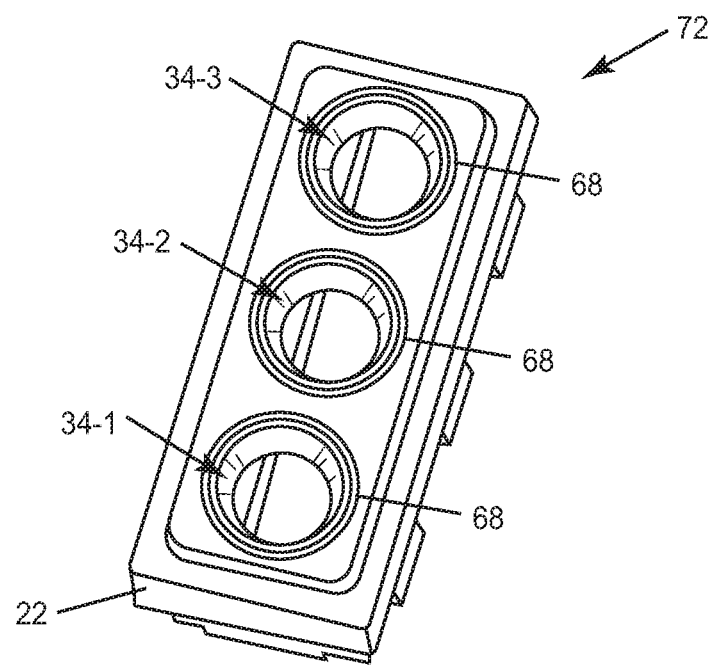
FIG. 12 is a perspective view of an LED package where the one or more surface features are provided in concentric arrangements around cavities of the LED package according to embodiments disclosed herein.

FIG. 12 is a perspective view of an LED package 72 where the one or more surface features 68 are provided in concentric arrangements around the cavities 34-1 to 34-3 of the body 22. As illustrated, individual surface features 68 are arranged peripherally around each of the cavities 34-1 to 34-3. The surface features 68 may comprise combinations of trenches, notches, cuts, cutouts, or texturing as previously described. By arranging a different surface feature 68 peripherally around each of the cavities 34-1 to 34-3, the encapsulant (40 of FIG. 4A) will have increased surface area to adhere with the body 22 in locations that are proximate or adjacent to the base of each of the lenses (42-1 to 42-3 of FIG. 4A). In this manner, the surface features 68 are arranged with shapes that correspond to the respective cavity 34-1 to 34-3 that the surface features 68 are registered to.

Figure 13:
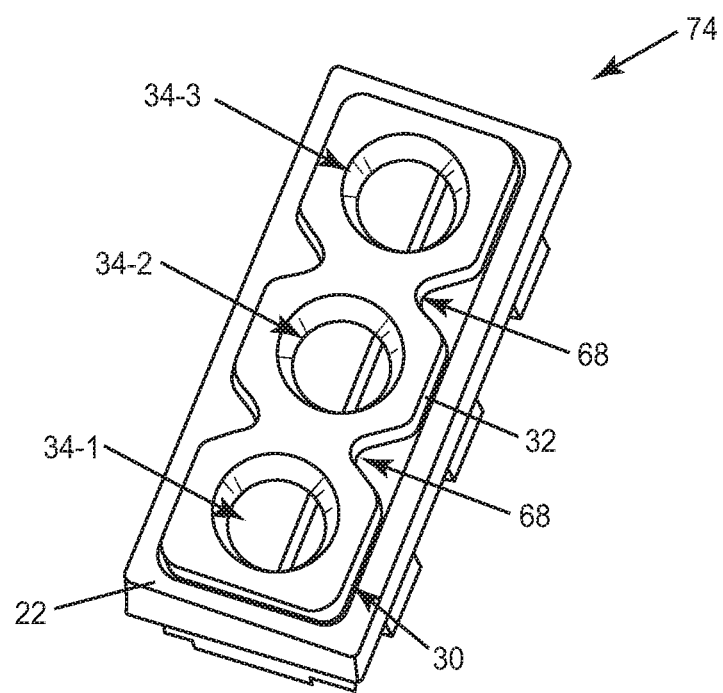
FIG. 13 is a perspective view of an LED package where the one or more surface features are provided along sidewalls of a body mesa of the LED package according to embodiments disclosed herein.

FIG. 13 is a perspective view of an LED package 74 where the one or more surface features 68 are provided along the sidewalls 32 of the body mesa 30. As illustrated, surface features 68 may be arranged as notches, cuts, v-cuts, and the like along one or more of the sidewalls 32 of the body mesa 30. In this manner, the encapsulant (40 of FIG. 4A) will have increased surface area to adhere to the body 22 along the sidewalls 32. In certain embodiments, the surface features 68 along the sidewalls 32 may be registered between adjacent ones of the cavities 34-1 to 34-3 of the body 22. As illustrated, the surface features 68 along the sidewalls 32 may comprise rounded edges or transitions in order to reduce sharp edges of the body 22 that may contribute to voids when the encapsulant material is formed.

Those skilled in the art will recognize improvements and modifications to the preferred embodiments of the present disclosure. All such improvements and modifications are considered within the scope of the concepts disclosed herein and the claims that follow.

What is claimed is:

1. A lighting emitting diode (LED) package comprising:
   a body comprising:
      a primary emission face;
      a mounting face; and
      a body mesa formed at the primary emission face, the body mesa forming at least two sidewalls that are coupled to one another by a rounded corner of the body mesa, wherein the body mesa forms a plurality of cavities at the primary emission face;
   a plurality of LED chips, wherein each cavity of the plurality of cavities comprises at least one LED chip of the plurality of LED chips; and
   an encapsulant over the plurality of LED chips and coupled to the at least two sidewalls and the rounded corner of the body mesa;
   wherein the encapsulant comprises a pigment that is registered with a first cavity of the plurality of cavities, the pigment corresponding to an emission color of the at least one LED chip that is within the first cavity.

2. The LED package of claim 1, wherein the encapsulant forms a plurality of lenses and a separate lens of the plurality of lenses is registered with each cavity of the plurality of cavities.

3. The LED package of claim 2, wherein each lens comprises a round lens base.

4. The LED package of claim 2, wherein each lens comprises an oval lens base.

5. The LED package of claim 2, wherein at least one lens comprises a round lens base and at least one other lens comprises an oval lens base.

6. The LED package of claim 1, wherein the encapsulant forms a lens that is registered with the first cavity of the plurality of cavities and the encapsulant further forms a flat surface that is registered with a second cavity of the plurality of cavities.

7. The LED package of claim 6, wherein a sensor device is arranged within the second cavity.

8. The LED package of claim 1, wherein the plurality of cavities are arranged with a linear alignment.

9. The LED package of claim 1, wherein one or more surface features are formed in the body mesa between adjacent cavities of the plurality of cavities.

10. The LED package of claim 1, wherein one or more surface features are formed along at least one of the at least two sidewalls of the body mesa.

11. The LED package of claim 1, wherein the pigment is a first pigment region registered with the first cavity and the encapsulant further comprises separate second and third pigment regions that are respectively registered with corresponding second and third cavities of the plurality of cavities, wherein the second pigment region corresponds to an emission color of the at least one LED chip that is within the second cavity and the third pigment region corresponds to an emission color of the at least one LED chip that is within the third cavity.

12. An LED package comprising:
a body comprising a primary emission face and a mounting face, the primary emission face forming a plurality of cavities that are arranged in a linear alignment;
a plurality of LED chips, wherein each cavity of the plurality of cavities comprises at least one LED chip of the plurality of LED chips; and
an encapsulant over the plurality of LED chips, the encapsulant forming a plurality of lenses and a separate lens of the plurality of lenses is registered with each cavity of the plurality of cavities;
wherein the encapsulant comprises a pigment that is registered with a first cavity of the plurality of cavities, the pigment corresponding to an emission color of the at least one LED chip that is within the first cavity.

13. The LED package of claim 12, wherein an aspect ratio of a length and width of the body is at least 2:1.

14. The LED package of claim 13, wherein the aspect ratio is in a range from about 2:1 to about 4:1.

15. The LED package of claim 12, wherein each lens comprises a round lens base.

16. The LED package of claim 12, wherein each lens comprises an oval lens base.

17. The LED package of claim 12, wherein at least one lens comprises a round lens base and at least one other lens comprises an oval lens base.

18. An LED package comprising:
a body comprising a primary emission face and a mounting face, the primary emission face forming a plurality of cavities;
a plurality of LED chips, wherein each cavity of the plurality of cavities comprises at least one LED chip of the plurality of LED chips; and
an encapsulant over the plurality of LED chips, the encapsulant forming a first lens that is registered with a first cavity of the plurality of cavities and a second lens that is registered with a second cavity of the plurality of cavities, wherein the first lens forms a shape that is different than the second lens;
wherein the encapsulant comprises a pigment that is registered with the first cavity that corresponds to an emission color of the at least one LED chip that is within the first cavity.

19. The LED package of claim 18, wherein the first lens comprises a round lens base and the second lens comprises an oval lens base.

20. The LED package of claim 18, wherein the encapsulant forms a flat surface that is registered with a third cavity of the plurality of cavities.

21. The LED package of claim 20, wherein a sensor device is arranged within the third cavity.

22. The LED package of claim 18, wherein the plurality of cavities are arranged with a linear alignment.

* * * * *